United States Patent
Hasegawa et al.

(10) Patent No.: US 6,289,045 B1
(45) Date of Patent: Sep. 11, 2001

(54) TRAINING METHOD IN A TIME DOMAIN EQUALIZER AND A DIGITAL DATA TRANSMISSION APPARATUS INCLUDING AN IMPROVED TRAINING APPARATUS

(75) Inventors: Kazutomo Hasegawa, Kawasaki; Yutaka Awata, Yokohama; Seiji Miyoshi, Kawasaki, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/201,114

(22) Filed: Nov. 30, 1998

(30) Foreign Application Priority Data

Jul. 7, 1998 (JP) .................................................. 10-191134

(51) Int. Cl.[7] .............................. H03H 7/30; H03H 7/40; H03K 5/159
(52) U.S. Cl. ............................................. 375/231; 708/323
(58) Field of Search .................................... 375/231, 230, 375/229, 350, 232, 233; 708/300, 322, 323; 333/18, 28 R, 166

(56) References Cited

U.S. PATENT DOCUMENTS

| | | | |
|---|---|---|---|
| 5,285,474 | * | 2/1994 | Chow et al. ........................ 375/231 |
| 5,461,640 | * | 10/1995 | Gatherer .............................. 375/231 |
| 5,870,432 | * | 2/1999 | Kerckhove ........................... 375/232 |
| 5,995,568 | * | 11/1999 | Molnar et al. ....................... 375/354 |
| 6,097,763 | * | 8/2000 | Djokovic et al. .................... 375/260 |
| 6,185,251 | * | 10/2000 | Fertner ................................ 375/231 |

FOREIGN PATENT DOCUMENTS 59-126330   7/1984   (JP) .

* cited by examiner

Primary Examiner—Chi Pham
Assistant Examiner—Phuong Phu
(74) Attorney, Agent, or Firm—Helfgott & Karas, P.C.

(57) ABSTRACT

In a training method in a time domain equalizer provided in a digital data transmission system for updating tap coefficients in the time domain equalizer so that an error between the tap coefficients and channel target characteristic becomes zero, the training method includes steps of: obtaining a first sum of the tap coefficients of the channel target characteristic before a rectangular window is provided to the tap coefficients, and storing the first sum in a memory; obtaining a second sum of the tap coefficients of the channel target characteristic after the rectangular window was provided to the tap coefficients; subtracting the second sum from the first sum, and dividing a resultant value of subtraction by the numbers of the tap coefficients existing within the rectangular window; and obtaining each of tap coefficients of the channel target characteristic by adding a divided value to each tap coefficient existing within the rectangular window.

12 Claims, 9 Drawing Sheets

TRAINING METHOD IN A TIME DOMAIN EQUALIZER AND A DIGITAL DATA TRANSMISSION APPARATUS INCLUDING AN IMPROVED TRAINING APPARATUS

BACKGROUND OF THE INVENTION

1. Field of the Invention

The present invention relates to a training method in a time domain equalizer and a digital data transmission apparatus including an improved training apparatus in a digital data transmission system.

2. Description of the Related Art

In general, there are two types in a digital data transmission system, i.e., one being a single-carrier transmission system which transmits data signals by using a single carrier, and the other being a multi-carrier transmission system which transmits the data signals by dividing them into a plurality of bit-strings, by encoding the plurality of bit-strings, and by using a plurality of carriers. Although the present invention can be applied to both single-carrier and multi-carrier transmission systems, the following explanations will be given in the training method in the time domain equalizer and the digital data transmission apparatus including the improved training apparatus in the multi-carrier transmission system.

Further, the multi-carrier transmission system usually can be applied to a transmission system called an asymmetric digital subscriber line (ADSL). A detailed structure of the above transmission system has been disclosed, for example, in the document published by John A. C. Bingham, titled "Multicarrier Modulation for Data Transmission: An idea whose Time Has Come", dated May 1990, in the IEEE Communication magazine.

SUMMARY OF THE INVENTION

The object of the present invention is to provide a training method which can easily correct DC components contained in the channel target characteristic and the characteristic in the time domain equalizer so as to become zero after a window process was provided to tap coefficients.

Another object of the present invention is to provide a training apparatus, provided in a digital data transmission apparatus, which can easily correct DC components, contained in the channel target characteristic and the characteristic in the time domain equalizer, so as to become zero after a window process was provided to tap coefficients.

In accordance with a first aspect of the present invention, there is provided a training method in a time domain equalizer provided in a digital data transmission system for updating tap coefficients in the time domain equalizer so that an error between the tap coefficients and channel target characteristic becomes zero, the training method including steps of: obtaining a first sum of the tap coefficients of the channel target characteristic before a rectangular window is provided to the tap coefficients, and storing the first sum in a memory; obtaining a second sum of the tap coefficients of the channel target characteristic after the rectangular window was provided to the tap coefficients; subtracting the second sum from the first sum, and dividing a resultant value of subtraction by the numbers of the tap coefficients existing within the rectangular window; and obtaining each of tap coefficients of the channel target characteristic by adding a divided value to each tap coefficient existing within the rectangular window.

In accordance with a second aspect of the present invention, there is provided a training method in a time domain equalizer in a digital data transmission system for updating tap coefficients in the time domain equalizer so that an error between the tap coefficients and channel target characteristic becomes zero, the training method including steps of: obtaining a first sum of the tap coefficients in the time domain equalizer before a rectangular window is provided to the tap coefficients, and storing the first sum in a memory; obtaining a second sum of the tap coefficients in the time domain equalizer after the rectangular window was provided to the tap coefficients; subtracting the second sum from the first sum, and dividing a resultant value of subtraction by the numbers of the tap coefficients existing within the rectangular window; and obtaining each of tap coefficients in the time domain equalizer by adding a divided value to each tap coefficient existing within the rectangular window.

In accordance with a third aspect of the present invention, there is provided a training apparatus provided in a digital data transmission apparatus for updating tap coefficients in a time domain equalizer so that an error between the tap coefficients and channel target characteristic becomes zero, the training apparatus including: a first unit for obtaining a first sum of the tap coefficients of the channel target characteristic before a rectangular window is provided to the tap coefficients, and storing the first sum in a storage unit; a second unit for obtaining a second sum of the tap coefficients of the channel target characteristic after the rectangular window was provided to the tap coefficients; a third unit for subtracting the second sum from the first sum, and dividing a resultant value of subtraction by the numbers of the tap coefficients existing within the rectangular window; and a fourth unit for obtaining each of tap coefficients of the channel target characteristic by adding a divided value to each tap coefficient existing within the rectangular window.

In accordance with a fourth aspect of the present invention, there is provided a training apparatus provided in a digital data transmission apparatus for updating tap coefficients in a time domain equalizer so that an error between the tap coefficients and the channel target characteristic becomes zero, the training apparatus including: a first unit for obtaining a first sum of the tap coefficients in the time domain equalizer before a rectangular window is provided to the tap coefficients, and storing the first sum in a storage unit; a second unit for obtaining a second sum of the tap coefficients in the time domain equalizer after the rectangular window was provided to the tap coefficients; a third unit for subtracting the second sum from the first sum, and dividing a resultant value of subtraction by the numbers of the tap coefficients existing within the rectangular window; and a fourth unit for obtaining each of tap coefficient in the time domain equalizer by adding a divided value to each tap coefficient existing within the rectangular window.

DESCRIPTION OF THE PREFERRED EMBODIMENTS

Before describing preferred embodiments, a basic structure of a multi-carrier transmission system and the operation thereof will be explained in detail with reference to the drawings.

Figure 4:
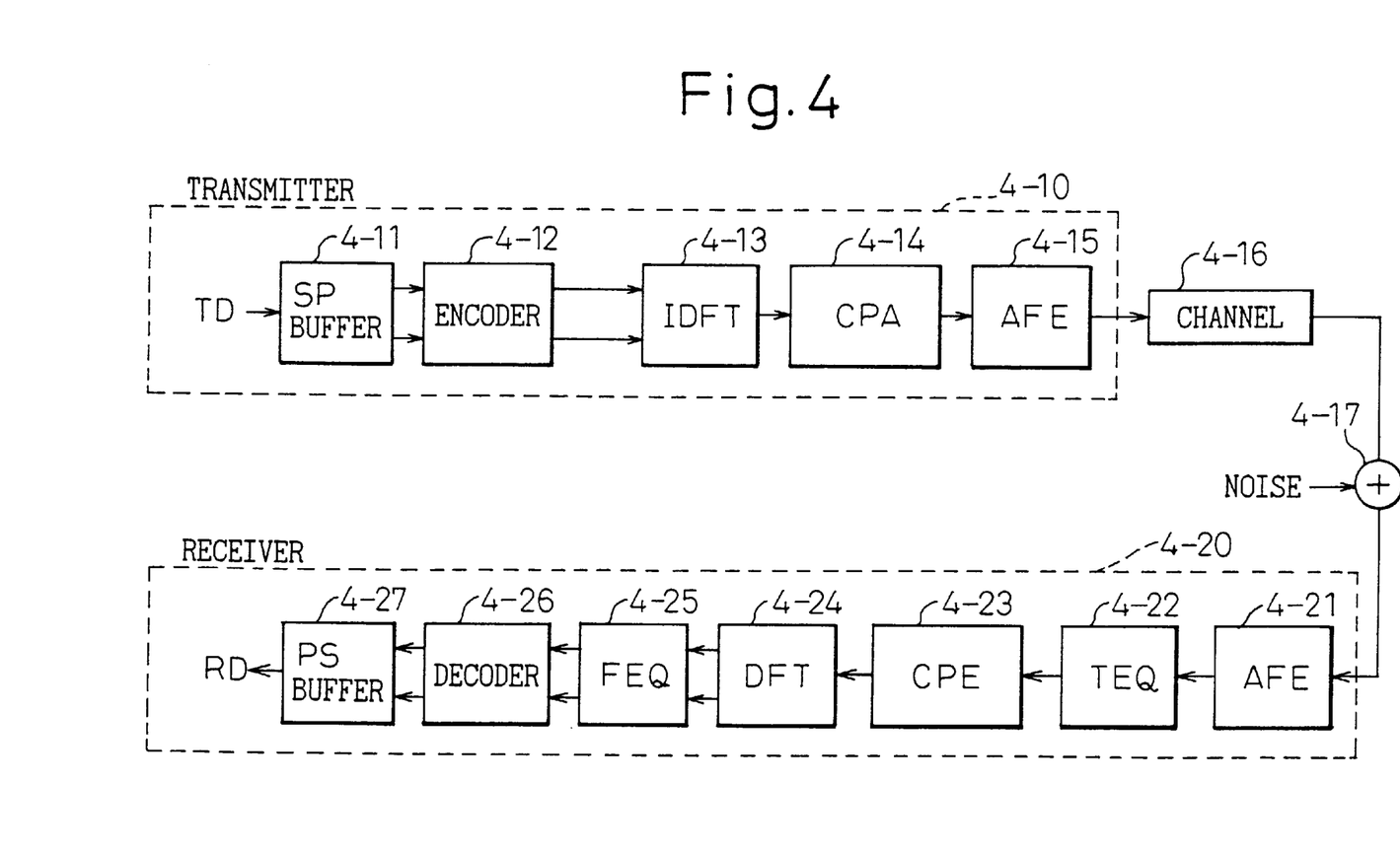
FIG. 4 is a basic structural view of a transmitter and receiver provided in a multi-carrier transmission system.

FIG. 4 is a basic structural view of a transmitter and receiver provided in a multi-carrier transmission system. In FIG. 4, reference number 4-10 denotes a transmitter which is formed by a serial-to-parallel (SP) converting buffer 4-11, an encoder 4-12, an inverted discrete Fourier transformer (IDFT) unit 4-13, a cyclic prefix adding (CPA) unit 4-14, and a transmission AFE (Analog Front End) unit 4-15 for performing digital-to-analog conversion and having a low-pass filter. Further, reference number 4-16 denotes a channel (i.e., a transmission path) provided between the transmitter and receiver, and the number 4-17 denotes a noise source superposed on the channel.

Reference number 4-20 denotes a receiver which is formed by a reception AFE (Analog Front End) 4-21 for performing analog-to-digital conversion and having a low-pass filter, a time domain equalizer (TEQ) 4-22, a cyclic prefix eliminating (CPE) unit 4-23, a discrete Fourier transform (DFT) unit 4-24, a frequency domain equalizer (FEQ) 4-25, a decoder 4-26, and a parallel-to-serial (PS) converting buffer 4-27 outputting the reception data (RD).

Bit strings of the transmission data (TD) are input to the SP buffer 4-11 which converts serial-bit strings to parallel-bit strings. The SP buffer 4-11 outputs the parallel-bit strings to the encoder 4-12.

The encoder 4-12 divides the parallel-bit strings into a plurality of parallel-bit string groups (n pieces), encodes each of parallel-bit string groups to coded information, and outputs the coded information to the IDFT unit 4-13. In this case, n pieces of the coded information (below, n-coded information) are assigned to n pieces of carriers, and each of carriers is transmitted as a symbol (i.e., a transmission symbol explained below).

The IDFT unit 4-13 performs the inverted discrete Fourier transform regarding n-coded information, and converts n-coded information from a signal on a frequency base (below, a frequency base signal) to a signal on a time base (below, a time base signal). In this case, in an actual calculation of the inverted discrete Fourier transform (IDFT), an inverted fast Fourier transform (IFFT) is used instead of the IDFT in order to realize high speed process of the calculation.

The time base signals converted by the IDFT unit 4-13 are transmitted to the cyclic prefix adding unit 4-14 in order to perform a cyclic prefix process which adds a predetermined data to the transmission symbol as explained below.

Figure 5A:
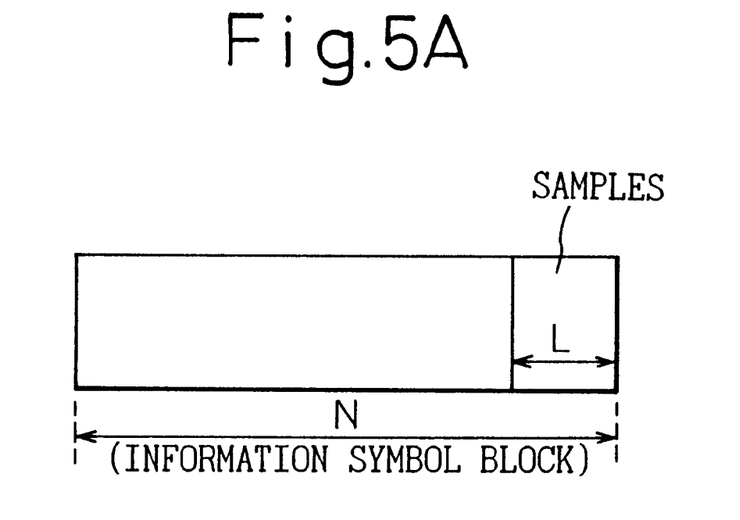
FIGS. 5A and 5B are views for explaining a cyclic prefix process.
Figure 5B:
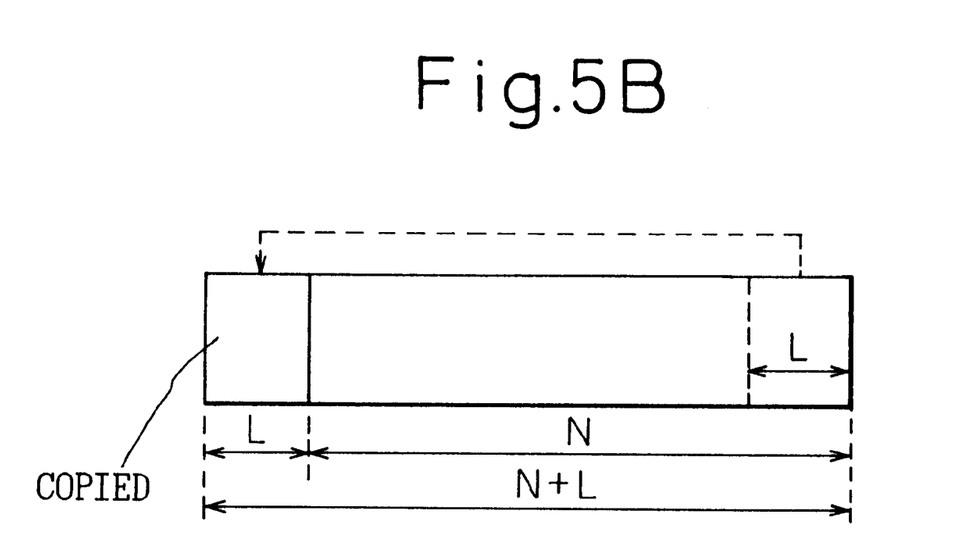

FIGS. 5A and 5B are views for explaining the cyclic prefix process. In FIGS. 5A and 5B, an information symbol block has a length N, and L pieces of samples (below, L-samples) are included in an end of the block. In the cyclic prefix process, as shown in FIG. 5A, initially, L-samples are included in the end of the information symbol block. Further, as shown in FIG. 5B, L-samples are copied and included in a head of the information symbol block. Accordingly, the length of the information symbol block becomes (N+L) so that the transmission symbol is transmitted as the signal having the length (N+L).

In this case, the transmission capacity is reduced to N/(N+L) times when performing the cyclic prefix process, compared to the transmission capacity in which the cyclic prefix process is not performed. This is because the transmission capacity is required for N in order to transmit the length N before the cyclic prefix process, but the transmission capacity is required for (N+L) in order to transmit the length N after the cyclic prefix process.

As mentioned in detail below, however, when performing the cyclic prefix process, it is possible to eliminate an inter-symbol interference (ISI), which is caused by a response characteristic of the channel (i.e., a transmission path, for example, a telephone network) 4-16 having a predetermined transmission delay, by using the cyclic prefix eliminating unit 4-23 and the time domain equalizer (TEQ) 4-22 in the reception side.

The signals in which the cyclic prefix process was performed are transmitted to the transmission AFE unit 4-15 which converts the digital signals to the analog signals. The analog signals are transmitted to the channel 4-16 through the low-pass filter provided in the AFE unit 4-15 itself.

In general, in the frequency band which is used for the data transmission, if an amplitude characteristic (i.e., a gain) and a group-delay characteristic of the channel are constant, no influence due to the channel distortion is given to the signals. However, since the frequency characteristic is not constant in the actual channel, the signals are influenced by the channel distortion.

In this case, if the distortion is very large, the influence applied to the signals also become large. Accordingly, large distortion results in an inter-channel interference (ICI) and the inter-symbol interference (ISI) so that this large distortion is applied to the reception signals.

The distorted signals are transmitted to the reception AFE unit 4-21 through the channel 4-16. In the reception AFE unit 4-21, noise components at high frequency are eliminated by the low-pass filter, the signals are converted to the digital signals, and the digital signals are output to the time domain equalizer (TEQ) 4-22.

Figure 6:
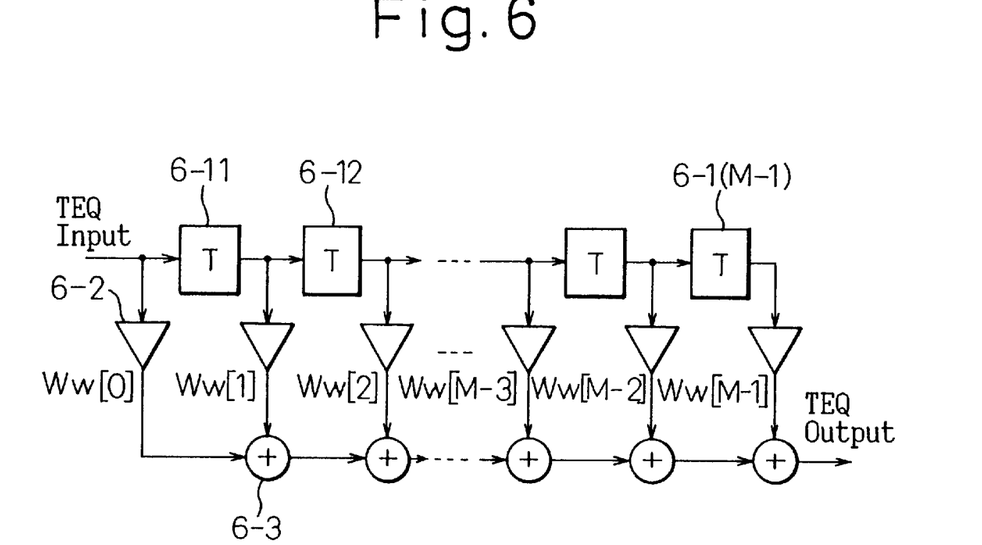
FIG. 6 is a structural view of a transversal filter provided in a time domain equalizer (TEQ)

FIG. 6 is a structural view of a transversal filter used in the time domain equalizer (TEQ). This transversal filter has tap length M. As shown in FIG. 6, (M−1)-delay elements (T), each of which has a predetermined amount of delay for each sampling period, are connected in series, and an input signal (TEQ Input) from the AFE unit 4-21 is input to the first delay element 6-11. Further, the input signal delayed by the first delay element 6-11 is input to the second delay element 6-12, and these steps are continued until the final delay element 6-1(M−1).

Further, as shown in the drawing, M-multipliers (W) 6-2 are provided to each output of the delay element (T) except for the first multiplier, and (M−1)-adders (+) 6-3 are provided to each output of the multiplier (W). Each multiplier (W) multiplies each output of the delay element (T) by each coefficient (Ww(0), Ww(1), . . . , Ww(M−1)). Still further, the outputs from all M-multipliers (W) are sequentially added by (M−1)-adders so that it is possible to obtain an output signal (TEQ Output) from the last adder as the output of the TEQ unit 4-22.

The time domain equalizer (TEQ) basically has a function which can reduce the number of taps of the channel characteristic (i.e., an impulse response characteristic) having an infinite length to a predetermined length L or less. Based on this function, it is possible to suppress the influence of the inter-symbol interference (ISI) at the reception signal into only the range of the cyclic prefix having the length L, as explained in detail in FIGS. 7A to 7D.

Figure 7A:
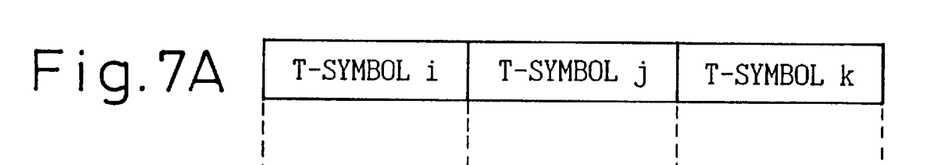
FIGS. 7A to 7D are views for explaining the reception symbol and an eliminating process of the cyclic prefix.
Figure 7B:
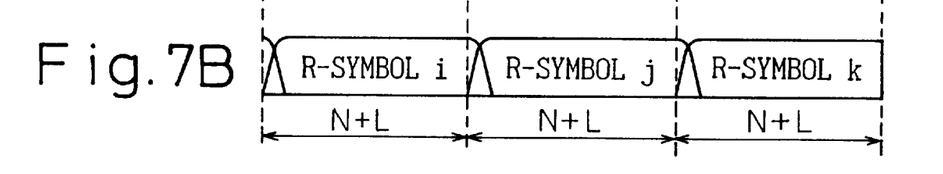
Figure 7C:
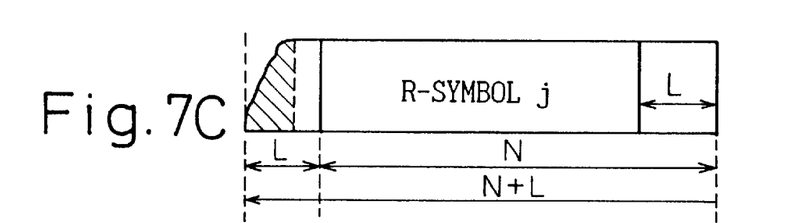

FIGS. 7A to 7D are views for explaining the reception symbol and an eliminating process of the cyclic prefix. In the drawings, FIG. 7A shows transmission symbols (T-SYMBOLi, T-SYMBOLj, T-SYMBOLk), and FIG. 7B shows reception symbols (R-SYMBOLi, R-SYMBOLj, R-SYMBOLk). As shown in FIG. 7B, each of reception symbols receives the transmission distortion so that the interference occurs at the boundary portion between reception symbols. Accordingly, as shown in FIG. 7C, the time domain equalizer (TEQ) 4-22 corrects the impulse response of the channel so as to become a minimum time width, and suppresses the distortion term caused by the ISI into the range of the length L or less of the cyclic prefix (see a slant portion and length L in FIG. 7C).

Figure 7D:
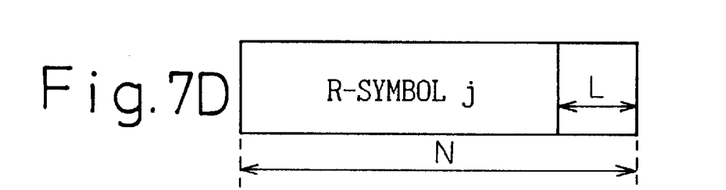

Further, as shown in FIG. 7D, the cyclic prefix eliminating unit 4-23 eliminates the cyclic prefix of the length L of the reception symbol which is output from the TEQ unit 4-22, and extracts the information symbol (R-SYMBOLj) having the length N which has no symbol inter-symbol interference (ISI).

Still further, the discrete Fourier transform (DFT) unit 4-24 converts the information symbol having the length N from the time base signal to the symbol data for each carrier on the frequency base. In this case, a fast Fourier transformer (FFT) unit is used instead of the DFT unit 4-24 in order to realize high speed process.

After above processes, the frequency domain equalizer (FEQ) 4-25 performs an equalizing process for the symbol data for each carrier on the frequency base. The decoder 4-26 decodes each symbol data to the data of parallel bit strings. Further, the parallel-to-serial (PS) conversion buffer 4-27 converts the data of parallel bit strings to the data of serial bit strings, and outputs the data of serial bit strings as the reception data from the receiver 4-20.

In this case, a training unit which is provided in the time domain equalizer (TEQ) 4-22, and which can basically reduce the number of taps of a channel characteristic (i.e., impulse response characteristic) having an infinite length into a predetermined length L, has been disclosed in the U.S. Pat. No. 5,285,474 (by Jacky Chow, John M. Chioffi, "METHOD FOR EQUALIZING A MULTI-CARRIER SIGNAL IN A MULTICARRIER COMMUNICATION SYSTEM").

Figure 8:
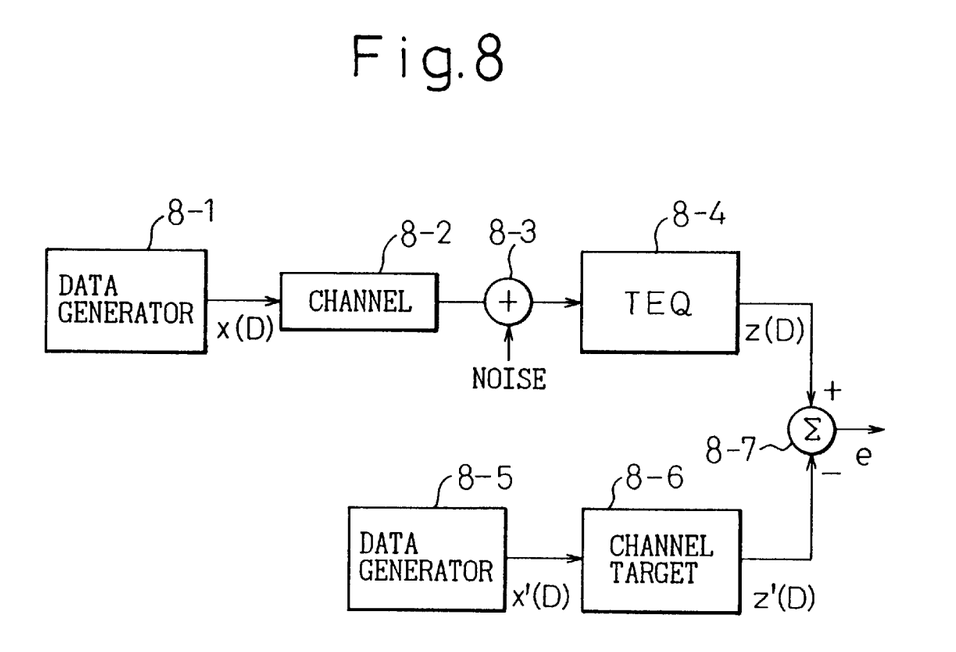
FIG. 8 is a view for explaining a training method in the TEQ unit in a conventional art.

FIG. 8 is a view for explaining a training method in the TEQ unit 4-22. In FIG. 8, reference number 8-1 denotes a data generator in the transmission side, numeral 8-2 is the channel, numeral 8-3 is noise which is superposed on the channel, numeral 8-4 is the time domain equalizer (TEQ), numeral 8-5 is a data generator in the reception side, numeral 8-6 is a channel target circuit for channel target characteristic, and numeral 8-7 is a subtracter. In the following descriptions, a signal indicated by a small character with (D) denotes a time domain signal (i.e.,time base signal), and a signal indicated by a large character denotes a frequency domain signal (i.e., frequency base signal).

In the training process in the TEQ unit 8-4, the data generator 8-1 in the transmission side generates a pseudo random signal x(D), and the data generator 8-5 in the reception side also generates the same pseudo random signal x'(D). The noise 8-3 is superposed on the pseudo random signal x(D) through the channel 8-2, and the pseudo random signal superposed with the noise is input to the TEQ unit 8-4 which outputs a signal z(D).

On the other hand, the pseudo random signal x'(D) from the data generator 8-5 is input to the channel target circuit 8-6 which outputs a signal z'(D). Further, the TEQ unit 8-4 adjusts the tap coefficients in such a way that an error "e" between the signals z(D) and z'(D) becomes zero, and the channel target circuit 8-6 also adjusts the tap coefficients in such a way that the error "e" between the signals z(D) and z'(D) becomes zero. These adjustments are mutually and repeatedly performed in order to adjust and update the tap coefficients until the error "e" becomes zero.

As a result of the above adjustments, it is possible to realize the channel target circuit 8-6 having the tap length L by using the tap coefficients of the TEQ unit 8-4 having the tap length M. Regarding the training unit, there are three known methods, i.e., a method of using a division on the frequency area, a method of using a stochastic gradient, for example, a least mean square (LMS) algorithm, and a method of combining the above methods.

Figure 9:
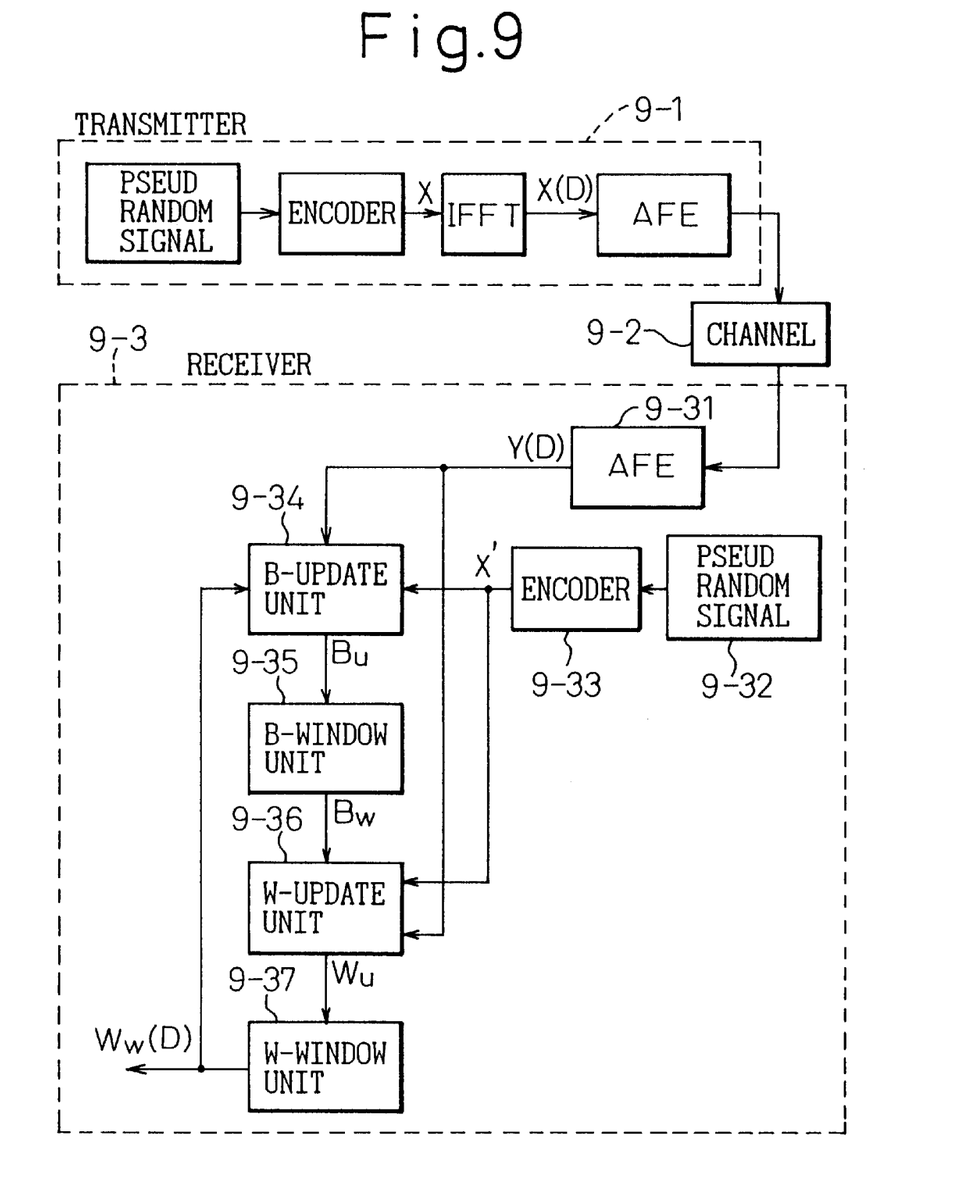
FIG. 9 is a structural view for updating tap coefficients of the time domain equalize (TEQ) in a conventional art.

FIG. 9 is a structural view for updating the tap coefficients in the time domain equalizer (TEQ). In FIG. 9, reference number 9-1 denotes a transmitter, numeral 9-2 is a channel, and numeral 9-3 is a receiver. The transmitter 9-1 is formed by a pseudo random signal generator, an encoder, an inverted fast Fourier transformer (IFFT) and an analog front end (AFE).

The receiver 9-3 is formed by an AFE unit 9-31 for performing analog-to-digital conversion and having a low-pass filter, a pseudo random signal generator 9-32, an encoder 9-33, an update unit 9-34 for updating a channel target characteristic B (below, a B-update unit), a window unit 9-35 for the channel target characteristic B (below, a B-window unit), an update unit 9-36 for updating a characteristic W (below, a W-update unit) of the time domain equalizer (TEQ), and a window unit 9-37 for the characteristic W (below, a W-window unit) of the time domain equalizer (TEQ).

The time base signals output from the transmitter 9-1 are influenced by external noise and inter-symbol interference (ISI) when passing through the channel 9-2, and the time base signals influenced by external noise and inter-symbol interference (ISI) are input to the receiver 9-3. In the receiver 9-3, the reception signals Y(D) from the AFE unit 9-31 are input in parallel to the B-update unit 9-34 and the W-update unit 9-36.

On the other hand, the output signals from the pseudo random signal generator 9-32 are encoded by the encoder 9-33, and the encoder 9-33 outputs the frequency base signals X' in parallel to the B-update unit 9-34 and the W-update unit 9-36.

The B-update unit 9-34 updates the channel target characteristic B based on the signals Y(D) from the AFE unit 9-31, the signals X' from the encoder 9-33, and the characteristic $W_w(D)$ from the W-window unit 9-37. The updated channel target characteristic $B_u$ are output to the B-window unit 9-35. Further, the B-window unit 9-35 performs a window process (i.e., to provide a window on the tap coefficients as shown in FIG. 1B) on the updated channel target characteristic B, and outputs the channel target characteristic $B_w$ on which the window process was performed, to the W-update unit 9-36.

The W-update unit 9-36 updates the characteristic W of the time domain equalizer (TEQ) based on the signals Y(D)

from the AFE unit 9-31, the signals X' from the encoder 9-33, and the channel target characteristic $B_w$ in such a way that an error E between a product (Y, W) and a product (X', $B_w$) becomes a minimum. In this case, the product (Y, W) is obtained by multiplying the frequency domain signal Y of the signals Y(D) and the characteristic W of the time domain equalizer (TEQ), and the product (X', $B_w$) is obtained by multiplying the signals X' and the channel target characteristic $B_w$ after the window process.

The updated characteristic $W_u$ are output to the W-window unit 9-37. The W-window unit 9-37 performs the window process to the updated characteristic $W_u$ of the time domain equalizer (TEQ), and outputs the characteristic $W_w$(D) in which the window process was performed.

Further, the process of the update of the channel target characteristic B and the window process, and the process of the update of the characteristic W of the TEQ and the window process, are repeated until the error E reaches a predetermined value or less.

As mentioned above, the training in the time domain equalizer (TEQ) includes the process in which the rectangular window is provided to the channel target characteristic B in order to limit the characteristic B in the range of predetermined finite numbers of the tap coefficients. Further, the DC components of the channel target characteristic $B_w$ are not always "zero" after the rectangular window was provided to the channel target characteristic $B_u$.

However, in actuality, many transformers and capacitors are usually provided in the actual channel. In this case, the DC components are not passed through these elements so that it is necessary that the DC components of the characteristic B are always zero. That is, if the DC components are included in the channel target characteristic B, that channel target characteristic B cannot be used as "channel target characteristic" in connection with the DC components.

As a result, in the following three processes, i.e., the process which updates the channel target characteristic B and performs the window process, the process which updates the characteristic W of the time domain equalizer (TEQ) and performs the window process, and the process in which the error E is converged to "zero", the occurrence of the DC components when the window process was provided, results in an obstacle for the process which obtains the characteristic $W_w$ of the time domain equalizer (TEQ) by converging the error E to zero.

As is obvious from the above explanations, the object of the present invention lies in that, if the window process is performed to both tap coefficients of the channel target characteristic $B_w$ and the characteristic $W_w$ of the time domain equalizer (TEQ), the present invention can make corrections so as not to produce the DC components in the channel target characteristic $B_w$ and the characteristic $W_w$ of the time domain equalizer (TEQ) after the window process was provided. As a result, according to the present invention, it is possible to derive the tap coefficients of the time domain equalizer (TEQ) with high precision.

Figure 1A:
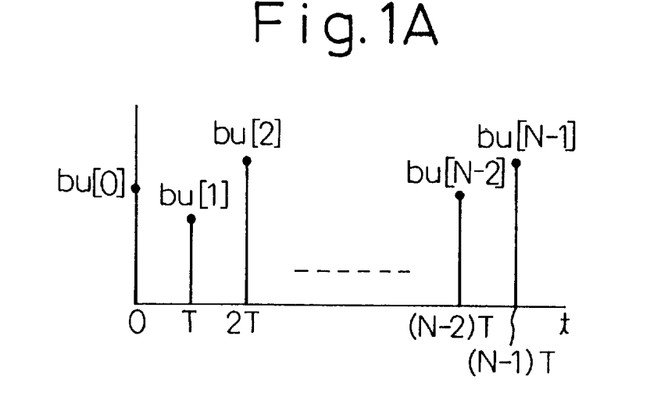
FIGS. 1A to 1C are views for explaining processes which corrects DC components of channel target characteristic according to the present invention.
Figure 1B:
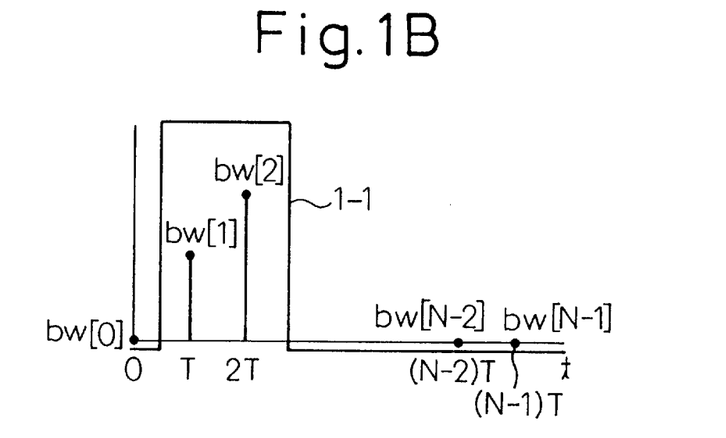
Figure 1C:
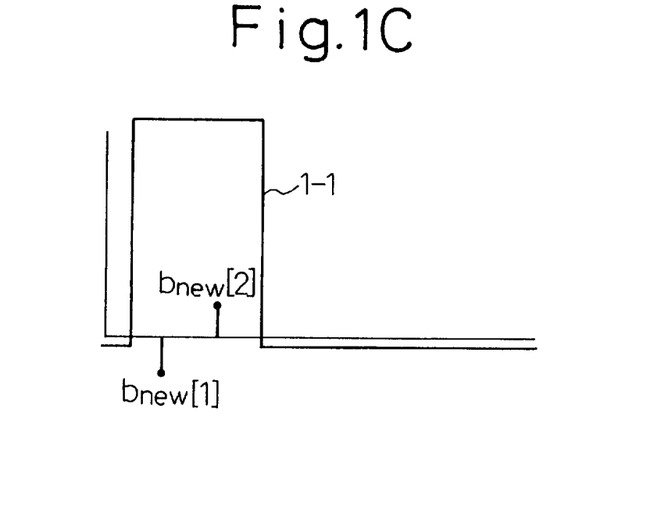

FIGS. 1A to 1C are views for explaining processes which correct the DC components of the channel target characteristic. FIG. 1A shows an impulse response characteristic of the channel target characteristic at the time domain before the rectangular window process is provided. In the drawing, each bu[i] (i=0, 1, . . . , N-1) denotes the tap coefficient for each sampling period T. In this case, the channel target characteristic represents collection of the tap coefficients. Further, FIG. 1B shows the channel target characteristic bw[i] (i=0, 1, . . . , N-1) at the time domain after the rectangular window was provided. Still further, FIG. 1C shows the new tap coefficient $b_{new}$[i] after the DC components were corrected according to the present invention.

The channel target characteristic B[ω] at the frequency domain can be expressed by the following formula (1) by using the tap coefficient b[i] (i=0, 1, . . . , N-1). Where, ω is an angular velocity, and when ω=0, this represents the DC component.

$$B(\omega)=\Sigma_{i=0}^{i=N-1}[b[i]\exp(-j\omega iT)] \quad (1)$$

That is, "i" is changed from 0 to N-1, and the value within the parenthesis [ ] is accumulated from 0 to N-1.

In the formula (1), when ω=0, the DC component B[0] of the channel target characteristic can be obtained as follows. That is, $$B[0]=\Sigma_{i=0}^{i=N-1}[b[i]] \quad (2)$$

When the DC component is $B_u$[0] before the rectangular window is provided, and when the impulse response of the channel target characteristic is bu[i] (i=0, 1, . . . , N-1) before the rectangular window is provided, the following formula (3) can be obtained since the DC component is $B_u$[0] before the rectangular window is provided.

$$B_u[0]=\Sigma_{i=0}^{i=N-1}[bu[i]]=0 \quad (3)$$

As shown in FIG. 1B, when the tap coefficient is bw[i] after the tap coefficient bu[i] (see FIG. 1A) of the channel target characteristic was processed by the rectangular window 1-1, when a sum of the tap coefficients existing within the rectangular window 1-1 is $b_{in}$SUM (in FIG. 1B, bw[1] and bw[2]), and when a sum of the tap coefficients existing outside of the rectangular window 1-1 is $b_{out}$SUM (in FIG. 1B, bw[0], bw[N-1], bw[N-2]), the formula (3) can be rewritten to the following formula (4).

$$B_u[0]=b_{in}\text{SUM}+b_{out}\text{SUM}=0 \quad (4)$$

In this case, although $b_{in}$SUM denotes the DC component $B_w$[0] of the channel target characteristic after the rectangular window was provided, the value of $b_{in}$SUM does not reach zero in almost all cases. Accordingly, it is possible to set the DC component $B_w$[0] of the channel target characteristic to zero after the rectangular window was provided, by performing the following correcting method, i.e., the value $b_{out}$SUM being divided by the number of taps L (below, L-taps), the divided value (i.e., a quotient) being added to each tap coefficient which exists within the rectangular window.

When L-tap coefficients existing within the rectangular window are bu[k], bu[k+1], . . . , bu[k+L-1], the process which corrects the tap coefficients existing within the rectangular window in order to set the DC component $B_w$[0] of the channel target characteristic to zero, can be expressed by the following formula (5).

$$B_w[0]=\Sigma_{i=k}^{i=k+L-1}[b_u[i]+b_{out}\text{SUM}/L]=0 \quad (5)$$

That is, after the rectangular window was provided to the channel target characteristic $B_u$, the process shown by the following formula (6) is performed to each of the tap coefficients existing within the rectangular window, and the resultant data is set to the new tap coefficient $b_{new}$[i ]. As a result, it is possible to perform correction in which the DC components of the channel target characteristic reach zero.

$$b_{new}[i] = bu[i] + b_{out}SUM/L \quad (6)$$

(i=k, k+1, ... , k+L−1)

The new tap coefficients $b_{new}[i]$ (i.e., $b_{new}[1]$, $b_{new}[2]$) after the DC components was corrected based on the formula (6), can be shown in FIG. 1C.

Figure 2:
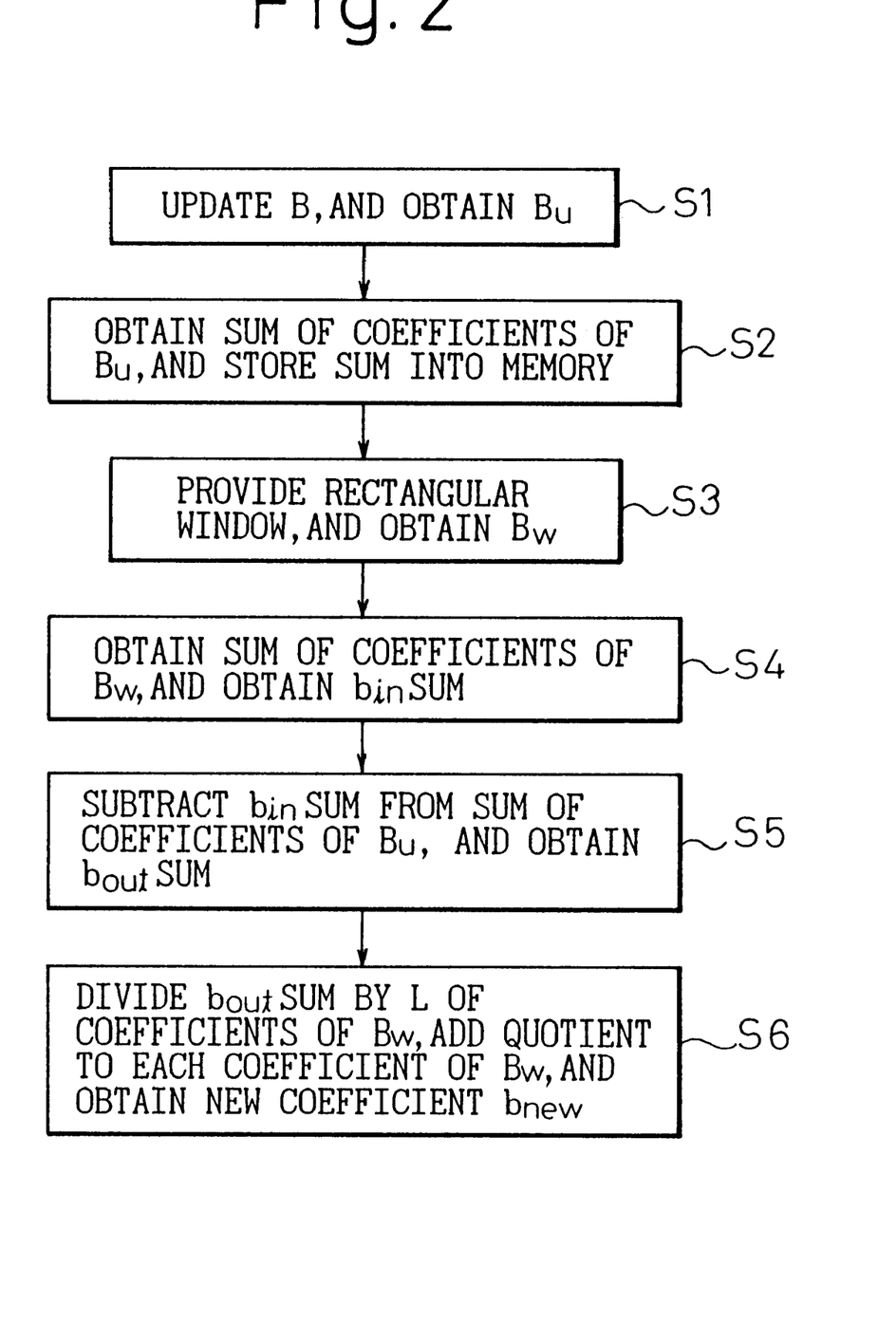
FIG. 2 is a flowchart for explaining correction of the DC components of the channel target characteristic according to the present invention.

FIG. 2 is a flowchart for explaining correction of the DC components of the channel target characteristic according to the present invention. As shown in FIG. 2, in step S1, the channel target characteristic B is updated, and the updated value is set as $B_u$. In step S2, a sum of the tap coefficients of the channel target characteristic $B_u$ is obtained, and the obtained sum is stored in a memory.

Next, in step S3, the rectangular window is provided to the updated channel target characteristic $B_u$ so that the windowed channel target characteristic $B_w$ can be obtained. In step S4, a sum of the tap coefficients of the characteristic $B_w$ is obtained, and $b_{in}SUM$ can be obtained. In step S5, $b_{in}SUM$ is subtracted from the sum of the tap coefficient of the characteristic $B_u$ stored in the memory, and $b_{out}SUM$ is obtained. Finally, in step S6, $b_{out}SUM$ is divided by L-tap coefficients of $B_w$ existing within the rectangular window, the resultant data (i.e, a quotient) is added to each coefficient of $B_w$, and the new tap coefficient $b_{new}[i]$ can be obtained. It is possible to obtain the channel target characteristic having no DC components based on the above steps.

In the above explanations, although the rectangular window was provided as a window function, it is possible to also correct the DC components so as to become zero by using the same method as mentioned above, if another window function is used. Further, although the channel target characteristic was explained in the above explanations, it is possible to also correct the DC components so as to become zero in the case of the tap coefficient of the time domain equalizer (TEQ).

Still further, in the means for correcting the channel target characteristic and the tap coefficients of the time domain equalizer (TEQ) and for eliminating the DC components, repetition of the update process and window process may be performed from the first, or later, in the B-update unit 9-34, the B-window unit 9-35, the W-update unit 9-36 and the W-window unit 9-37.

Figure 3:
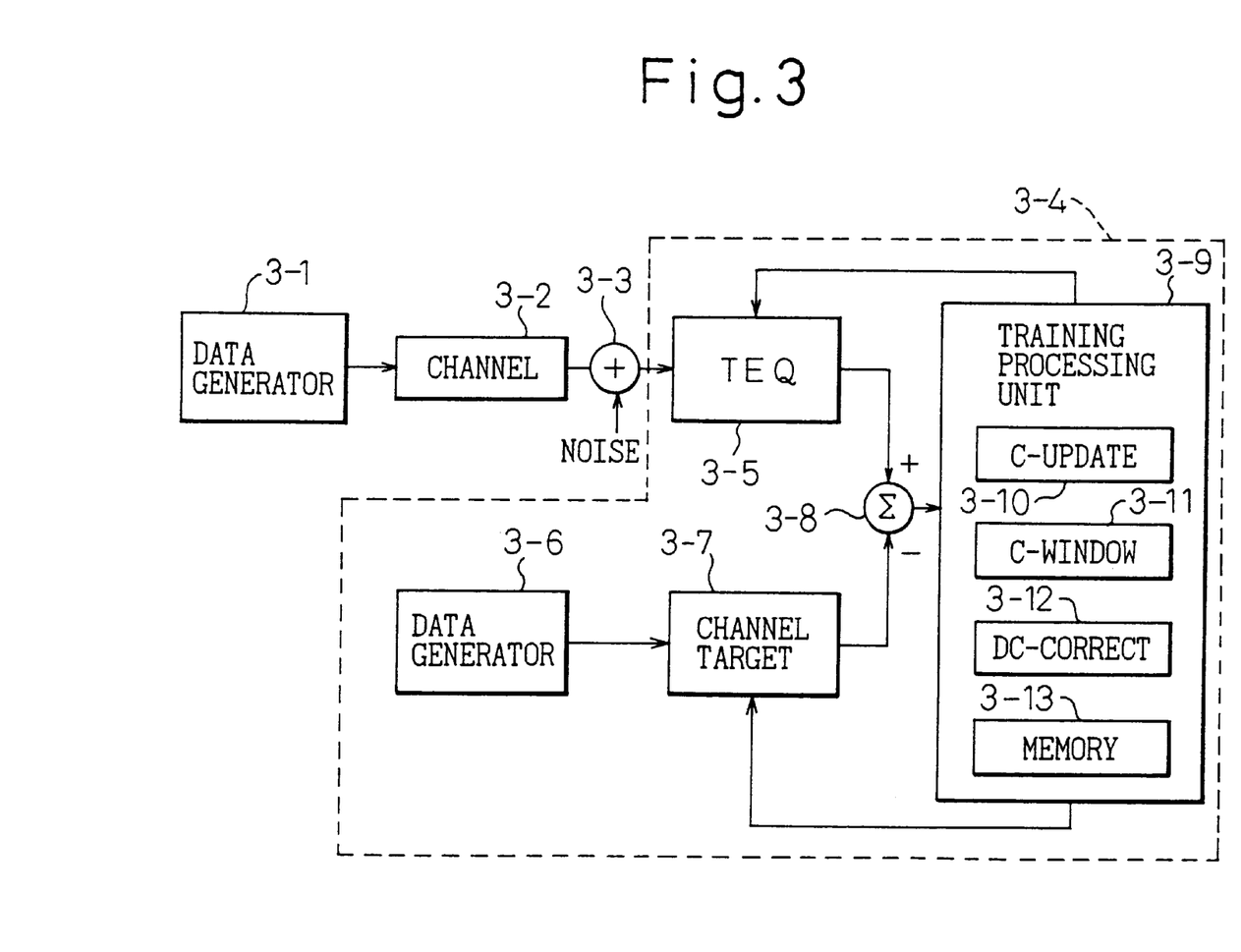
FIG. 3 is a block diagram of a digital data transmission apparatus including an improved training apparatus according to the present invention.

FIG. 3 is a block diagram of a digital data transmission apparatus including the training apparatus according to the present invention. In FIG. 3, reference number 3-1 a data generator provided in the transmission side, numeral 3-2 is a channel (i.e., a transmission path, for example, a telephone network), numeral 3-3 is noise source which are superposed on the channel, and numeral 3-4 is a digital data transmission apparatus provided in the reception side.

Further, the digital data transmission apparatus 3-4 in the reception side includes a time domain equalizer (TEQ) 3-5, a data generator 3-6 in the reception side, a channel target characteristic circuit (i.e., a channel target circuit) 3-7, a subtracter 3-8 and a training processing unit 3-9 of the tap coefficients.

Still further, the training processing apparatus 3-9 according to an embodiment of the present invention includes a tap coefficient update unit (C-UPDATE) 3-10, a tap coefficient window processing unit (C-WINDOW) 3-11, a DC component correcting unit (DC-CORRECT) 3-12, and a storage unit (MEMORY) 3-13.

As is obvious from the drawing, since this is the same structure as that of FIG. 8 except for the training processing apparatus 3-9, the explanations are given to the training processing apparatus 3-9 below.

As the training process in the training processing apparatus 3-9, the tap coefficient update unit 3-10 updates the tap coefficients in the time domain equalizer (TEQ) 3-5 in such a way that an error between the tap coefficients of the time domain equalizer (TEQ) 3-5 and the channel target characteristic becomes minimum.

Further, in the training processing apparatus 3-9, the tap coefficient window processing unit 3-11 and the DC component correcting unit 3-12 perform the following steps in order to correct (i.e., eliminate) the DC components so as to become zero. That is, first, a first sum of tap coefficients of the channel target characteristic is obtained before the rectangular window is provided to the channel target characteristic, and the first sum is stored in the memory 3-13.

Next, the rectangular window is provided to the tap coefficients of the channel target characteristic, and a second sum of tap coefficients existing within the rectangular window is obtained. Next, the second sum is subtracted from the first sum, and the resultant data is divided by the number of tap coefficients existing within the rectangular window. Finally, the divided value (i.e., a quotient) is added to each tap coefficient existing within the rectangular window in order to obtain each tap coefficient of the channel target characteristic. As a result, it is possible to correct the DC components of the channel target characteristic so as to become zero after the window process was provided.

Still further, in the training processing apparatus 3-9, the tap coefficient window processing unit 3-11 and the DC component correcting unit 3-12 perform the following steps in order to correct the DC components so as to become zero. That is, first, a first sum of tap coefficients in the time domain equalizer is obtained before the rectangular window is provided, and the first sum is stored in the memory.

Next, the rectangular window is provided to the tap coefficients in the time domain equalizer, and a second sum of tap coefficients existing within the rectangular window is obtained. Next, the second sum is subtracted from the first sum, and the resultant data is divided by the number of tap coefficients existing within the rectangular window. Finally, the divided value (i.e., a quotient) is added to each tap coefficient existing within the rectangular window in order to obtain each tap coefficient in the time domain equalizer. As a result, it is possible to correct the DC components of the time domain equalizer so as to become zero after the window process was provided.

What is claimed is:

1. A training method in a time domain equalizer provided in a digital data transmission system for updating tap coefficients in the time domain equalizer so that an error between the tap coefficients and channel target characteristic becomes zero, the training method comprising steps of:

obtaining a first sum of the tap coefficients of the channel target characteristic before a rectangular window is provided to the tap coefficients, and storing the first sum in a memory;

obtaining a second sum of the tap coefficients of the channel target characteristic after the rectangular window was provided to the tap coefficients;

subtracting the second sum from the first sum, and dividing a resultant value of subtraction by the numbers of the tap coefficients existing within the rectangular window; and obtaining each of tap coefficients of the channel target characteristic by adding a divided value to each tap coefficient existing within the rectangular window.

2. A training method in a time domain equalizer in a digital data transmission system for updating tap coefficients in the time domain equalizer so that an error between the tap coefficients and channel target characteristic becomes zero, the training method comprising steps of:

obtaining a first sum of the tap coefficients in the time domain equalizer before a rectangular window is provided to the tap coefficients, and storing the first sum in a memory;

obtaining a second sum of the tap coefficients in the time domain equalizer after the rectangular window was provided to the tap coefficients;

subtracting the second sum from the first sum, and dividing a resultant value of subtraction by the numbers of the tap coefficients existing within the rectangular window; and obtaining each of tap coefficients in the time domain equalizer by adding a divided value to each tap coefficient existing within the rectangular window.

3. A training method in a time domain equalizer as claimed in claim 1, wherein the digital data transmission system is a multi-carrier transmission system.

4. A training method in a time domain equalizer as claimed in claim 2, wherein the digital data transmission system is a multi-carrier transmission system.

5. A training method in a time domain equalizer as claimed in claim 1, wherein the digital data transmission system is a single-carrier transmission system.

6. A training method in a time domain equalizer as claimed in claim 2, wherein the digital data transmission system is a single-carrier transmission system.

7. A training apparatus provided in a digital data transmission apparatus for updating tap coefficients in a time domain equalizer so that an error between the tap coefficients and channel target characteristic becomes zero, the training apparatus comprising:

a first means for obtaining a first sum of the tap coefficients of the channel target characteristic before a rectangular window is provided to the tap coefficients, and storing the first sum in a storage unit;

a second means for obtaining a second sum of the tap coefficients of the channel target characteristic after the rectangular window was provided to the tap coefficients;

a third means for subtracting the second sum from the first sum, and dividing a resultant value of subtraction by the numbers of the tap coefficients existing within the rectangular window; and a fourth means for obtaining each of tap coefficients of the channel target characteristic by adding a divided value to each tap coefficient existing within the rectangular window.

8. A training apparatus provided in a digital data transmission apparatus for updating tap coefficients in a time domain equalizer so that an error between the tap coefficients and channel target characteristic becomes zero, the training apparatus comprising:

a first means for obtaining a first sum of the tap coefficients in the time domain equalizer before a rectangular window is provided to the tap coefficients, and storing the first sum in a storage unit;

a second means for obtaining a second sum of the tap coefficients in the time domain equalizer after the rectangular window was provided to the tap coefficients;

a third means for subtracting the second sum from the first sum, and dividing a resultant value of subtraction by the numbers of the tap coefficients existing within the rectangular window; and a fourth means for obtaining each of tap coefficient in the time domain equalizer by adding a divided value to each tap coefficient existing within the rectangular window.

9. A training apparatus as claimed in claim 7, wherein the digital data transmission apparatus is a digital data transmission apparatus in a multi-carrier transmission system.

10. A training apparatus as claimed in claim 8, wherein the digital data transmission apparatus is a digital data transmission apparatus in a multi-carrier transmission system.

11. A training apparatus as claimed in claim 7, wherein the digital data transmission apparatus is a digital data transmission apparatus in a single-carrier transmission system.

12. A training apparatus as claimed in claim 8, wherein the digital data transmission apparatus is a digital data transmission apparatus in a single-carrier transmission system.

* * * * *